(12) United States Patent
Chou et al.

(10) Patent No.: US 10,243,108 B1
(45) Date of Patent: Mar. 26, 2019

(54) LIGHT EMITTING DIODE HAVING CONTINUOUS ELECTRODE STRUCTURE

(71) Applicant: HIGH POWER OPTO. INC., Taichung (TW)

(72) Inventors: Li-Ping Chou, Taichung (TW); Wan-Jou Chen, Taichung (TW); Wei-Yu Yen, Taichung (TW); Chih-Sung Chang, Taichung (TW)

(73) Assignee: High Power Opto. Inc., Taichung (TW)

( * ) Notice: Subject to any disclaimer, the term of this patent is extended or adjusted under 35 U.S.C. 154(b) by 17 days.

(21) Appl. No.: 15/707,312

(22) Filed: Sep. 18, 2017

(51) Int. Cl.
*H01L 33/00* (2010.01)
*H01L 33/38* (2010.01)
*H01L 33/08* (2010.01)
*H01L 27/15* (2006.01)
*H01L 33/24* (2010.01)
*H01L 33/10* (2010.01)

(52) U.S. Cl.
CPC .......... *H01L 33/387* (2013.01); *H01L 27/153* (2013.01); *H01L 33/08* (2013.01); *H01L 33/10* (2013.01); *H01L 33/24* (2013.01); *H01L 33/00* (2013.01); *H01L 2924/00* (2013.01)

(58) Field of Classification Search
CPC ....... H01L 33/387; H01L 33/08; H01L 33/10; H01L 33/24; H01L 27/153; H01L 33/20; H01L 2924/00; H01L 2924/48091; H01L 2924/0002
See application file for complete search history.

(56) References Cited

U.S. PATENT DOCUMENTS

| 2010/0171135 | A1* | 7/2010 | Engl | H01L 33/382 |
| | | | | 257/98 |
| 2011/0220871 | A1* | 9/2011 | Kamikawa | B82Y 20/00 |
| | | | | 257/13 |
| 2011/0297972 | A1* | 12/2011 | Seo | H01L 25/0753 |
| | | | | 257/88 |

* cited by examiner

*Primary Examiner* — Frederick B Hargrove
*Assistant Examiner* — Patricia D Reddington
(74) *Attorney, Agent, or Firm* — Muncy, Geissler, Olds & Lowe, P.C.

(57) ABSTRACT

A present invention includes a negative electrode, a substrate, an adhesive layer, an insulation layer and a reflective layer sequentially stacked. A P-type semiconductor layer, a light emitting layer and an N-type semiconductor layer are sequentially stacked on the reflective layer to form an LED light emitting layer. A positive electrode, spaced from the LED light emitting layer, is further stacked on the reflective layer. The present invention further includes an electrical connection structure that penetrates through the insulation layer, and penetrates through, in a spaced manner from the insulation layer, the reflective layer, the P-type semiconductor layer and the light emitting layer. The electrical connection structure is electrically connected to the adhesive layer and the N-type semiconductor layer, and has a pattern distribution. The pattern distribution is least one strip-like shape to form the continuous electrode structure.

5 Claims, 6 Drawing Sheets

LIGHT EMITTING DIODE HAVING CONTINUOUS ELECTRODE STRUCTURE

FIELD OF THE INVENTION

The present invention relates to a light source structure of a light emitting diode (LED), and particularly to an LED structure having a continuous electrode structure.

BACKGROUND OF THE INVENTION

A light emitting diode (LED) is a cold light emitting element. A light emitting principle of an LED is that, a forward bias (current) is applied to a III-V compound semiconductor material, electrons and holes in a diode are combined to convert energy into light, and light is then emitted when the energy is released. The temperature of an LED does not get high as an incandescent light bulb even when the LED is used for an extended period of time. LEDs feature advantages of having a small volume, a long lifecycle, a low driving voltage, a fast response speed and outstanding shock resistance, can adapt to requirements of being light and compact as well as miniaturization of various apparatus, and are popular products in the daily lives.

To have an LED emit white light, one mainstream approach is producing light in other colors by using fluorescent powder and the light in different colors is blended. However, to prevent an electrode from interfering the applying of fluorescent powder, as shown in FIG. 1 and FIG. 2, an LED structure disclosed includes a negative electrode 1, a substrate 2, an adhesive layer 3, an insulation layer 4, a reflective layer 5, a P-type semiconductor layer 6, a light emitting layer 7, an N-type semiconductor layer 8, and a positive electrode 9. A plurality of through electrodes 10 are used to connect the N-type semiconductor layer 8 and the negative electrode 1 to provide the N-type semiconductor layer 8 with a voltage supply needed. A surface of the N-type semiconductor layer 8 directly serves as a light exiting surface. Thus, the light exiting surface is not provided with any electrode, and is free from the issue of an electrode interfering the applying of fluorescent powder.

Referring to FIG. 3, in the structure shown, a corresponding region 11 of the plurality of through electrodes 10 provided reduces an effective light emitting region of the reflective layer 7, yielding degraded light emitting efficiency and less uniform light emitting effect at a border region 12.

SUMMARY OF THE INVENTION

In view of the above, it is an object of the present invention to provide a light emitting diode (LED) having a continuous electrode structure so as to reduce an ineffective light emitting area and increase a light emitting region while lowering production complexity to effectively reduce costs.

An LED having a continuous electrode structure of the present invention includes a substrate, a negative electrode, an adhesive layer, an insulation layer, a reflective layer, a positive electrode, an LED light emitting layer and an electrical connection structure. The negative electrode is formed under the substrate. The adhesive layer is formed on the substrate. The insulation layer is formed on the adhesive layer. The reflective layer is formed on the insulation layer. The LED light emitting layer and the positive electrode are formed on the reflective layer, and are spaced by a gap. The LED light emitting layer includes a P-type semiconductor layer, a light emitting layer and an N-type semiconductor layer that are sequentially stacked thereon.

The electrical connection structure penetrates through the insulation layer, and further penetrates through, at a spaced manner from insulation layer, the reflective layer, the P-type semiconductor layer and the light emitting layer, to be electrically connected to the adhesive layer and the N-type semiconductor layer. That is, the electrical connection structure is not electrically conducted with the reflective layer, the P-type semiconductor layer and the light emitting layer. The electrical connection structure has a pattern distribution, which is least one strip-like shape to form the continuous electrode structure.

Accordingly, an ineffective area caused by the insulation layer can be effectively reduced through the contour of the pattern distribution. Further, because the border region is similar to current diffusion paths, light is more uniformly emitted from the border region. In addition, the strip-shaped continuous electrode structure is a continuous interface that can be more easily processed in a manufacturing process compared to a conventional discontinuous interface, facilitating processes of micro-etching and coating.

DETAILED DESCRIPTION OF THE PREFERRED EMBODIMENTS

To better understand and appreciate the features, objects and effects of the present invention, a preferred embodiment is described in detail with the accompanying drawings below.

Figure 4:
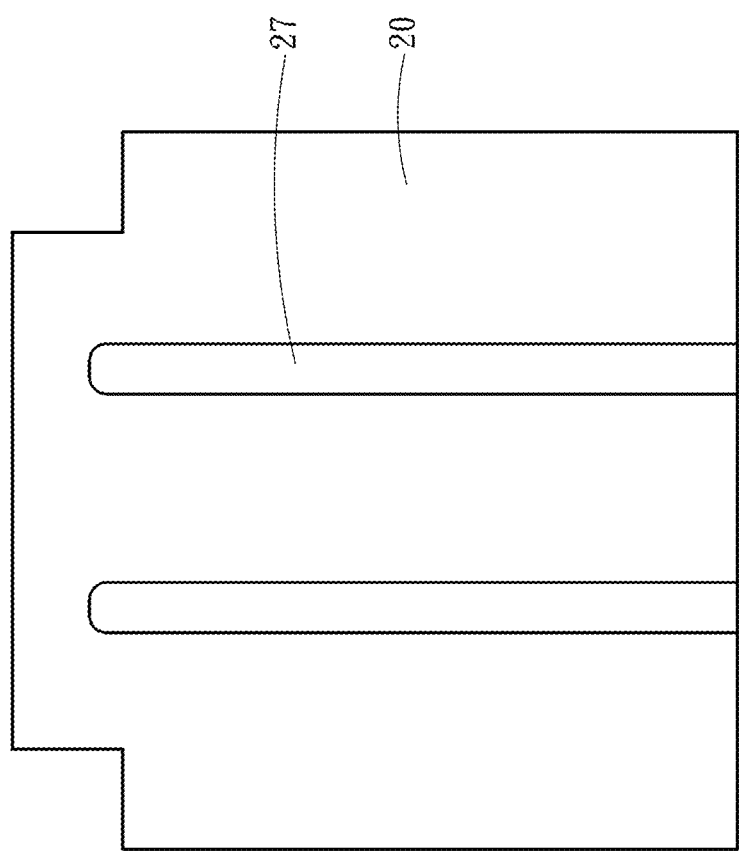
FIG. 4 is a section view of a pattern distribution of a through electrode of the present invention.
Figure 5:
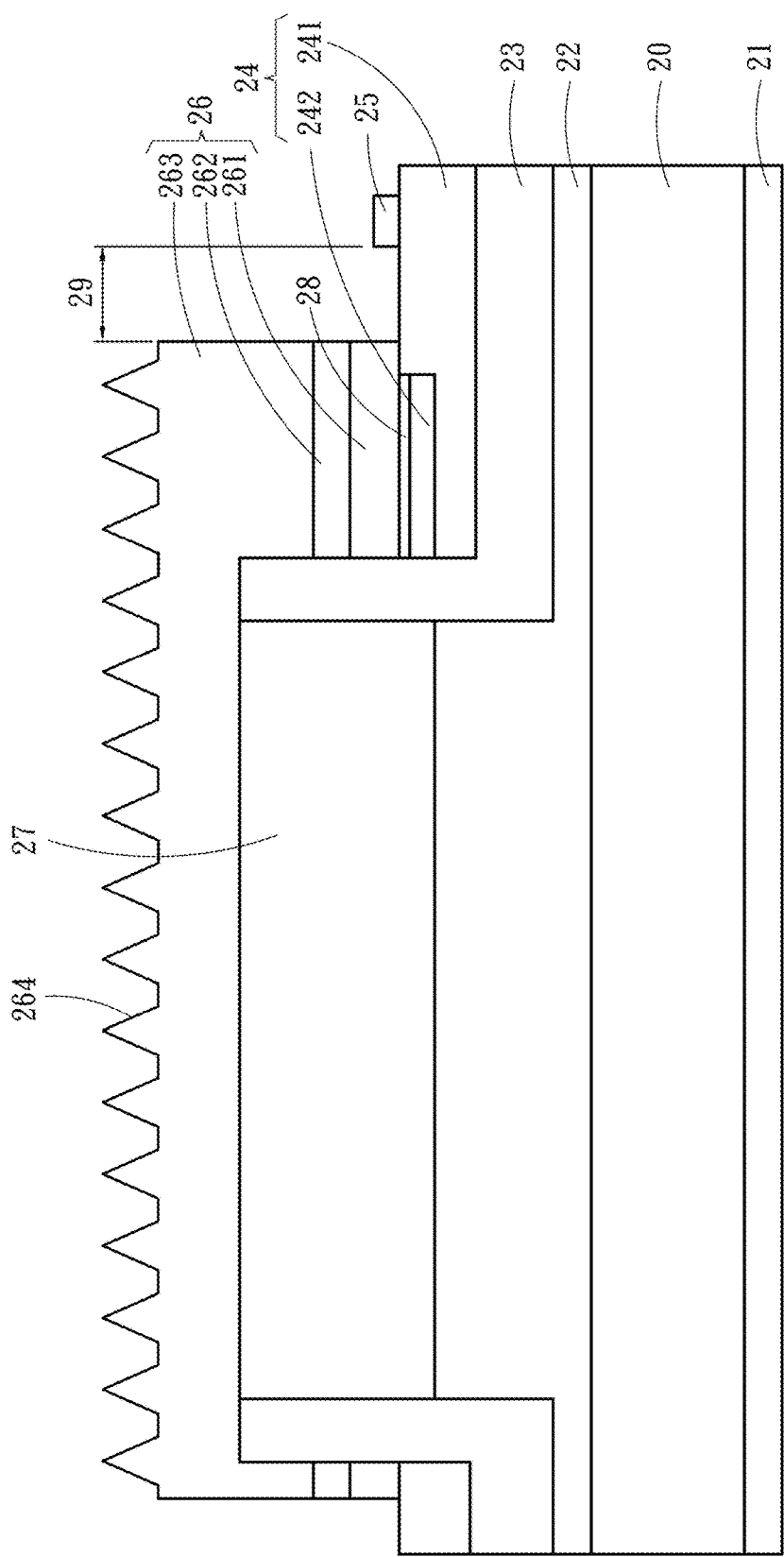
FIG. 5 is a section view of an LED structure of the present invention.

Referring to FIG. 4 and FIG. 5, the present invention provides a light emitting diode (LED) light emitting layer structure having a continuous electrode structure. The LED light emitting layer 26 structure includes a substrate 20, a negative electrode 21, an adhesive layer 22, an insulation layer 23, a reflective layer 24, a positive electrode 25, an LED light emitting layer 26 and an electrical connection structure 27. The negative electrode 21 is formed under the substrate 20. The adhesive layer 22 is formed on the substrate 20. The substrate 20 may be selected from a conductive material such as silicon, geranium, copper and copper tungsten, for example. The adhesive layer 22 may be selected from a conductive material such as gold-indium alloy, gold-tin alloy, nickel-tin alloy and gold, for example, and is used to adhere the substrate 20, the insulation layer 23 and the electrical connection structure 27. The LED light emitting layer 26 includes a P-type semiconductor layer 261, a light emitting layer 262 and an N-type semiconductor layer 263 that are sequentially stacked on the reflective layer 24.

The electrical connection structure 27 penetrates through the insulation layer 23, and penetrates through, in a spaced manner from the insulation layer 23, the reflective layer 24, the P-type semiconductor layer 261 and the light emitting layer 262, allowing the electrical connection structure 27 to be electrically connected to the adhesive layer 22 and the N-type semiconductor layer 263. The electrical connection structure 27 is selected from a conductive material; the insulation layer 23 is primarily made of a metal oxide, a metal nitride or a polymer. That is, the electrical connection structure 27 is not electrically conducted with the reflective layer 24, the P-type semiconductor layer 261 and the light emitting layer 262. Further, the electrical connection structure 27 has a pattern distribution, which is at least one strip-like shape to form a continuous electrode structure.

The reflective layer 24 is formed on the insulation layer 23, and may include a reflecting mirror protection layer 241, which may be a metal or a mutual alloy selected from nickel, platinum, tungsten and titanium, and a reflecting mirror 242, which may be selected from nickel, silver, nickel-silver alloy, aluminum and aluminum-silver alloy. The reflecting mirror 242 is formed under the P-type semiconductor layer 261, and envelops the reflecting mirror 242 so as to prevent the reflecting mirror 242 from oxidation and to maintain good reflectivity. Further, an ohmic contact layer 28 may be formed between the reflecting mirror 242 and the P-type semiconductor layer 261. The ohmic contact layer 28 may be selected from nickel, silver, nickel-silver alloy and indium tin oxide to reduce contact resistance.

The LED light emitting layer 26 and the positive electrode 25 are formed on the reflective layer 24, and are spaced by a gap 29; that is, the LED light emitting layer 26 and the positive electrodes 25 are not in direct contact. The LED light emitting layer 26 may be selected from a group III material such as a III-nitride, III-phosphide and III-arsenide. A jagged structure 264 may be further formed on a surface of the N-type semiconductor layer 263 to increase the light extraction rate.

Figure 1:
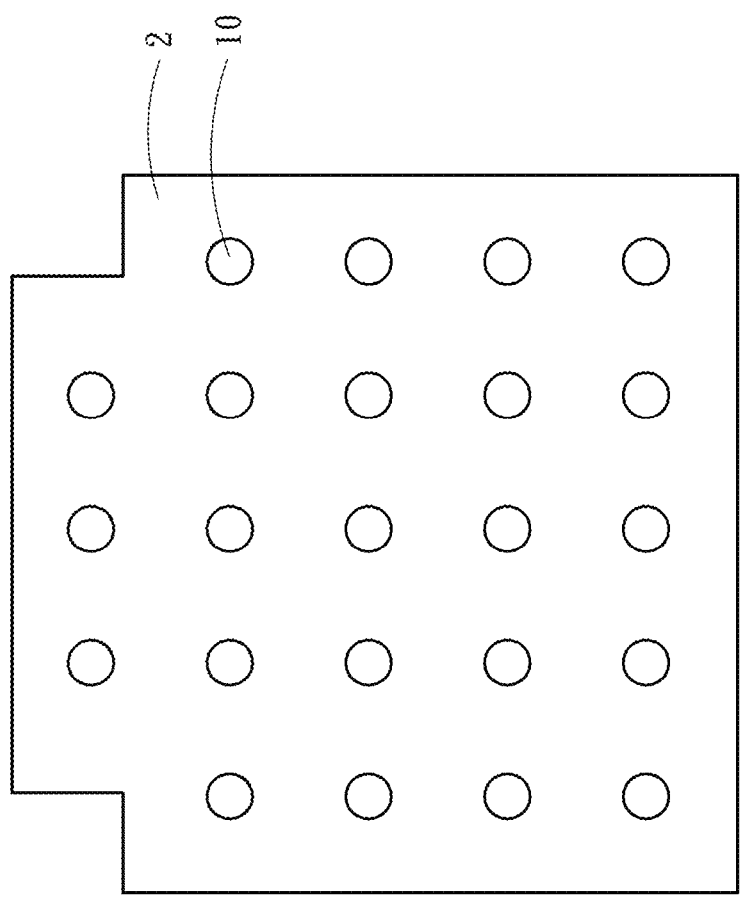
FIG. 1 is a section view of a pattern distribution of a conventional through electrode.
Figure 2:
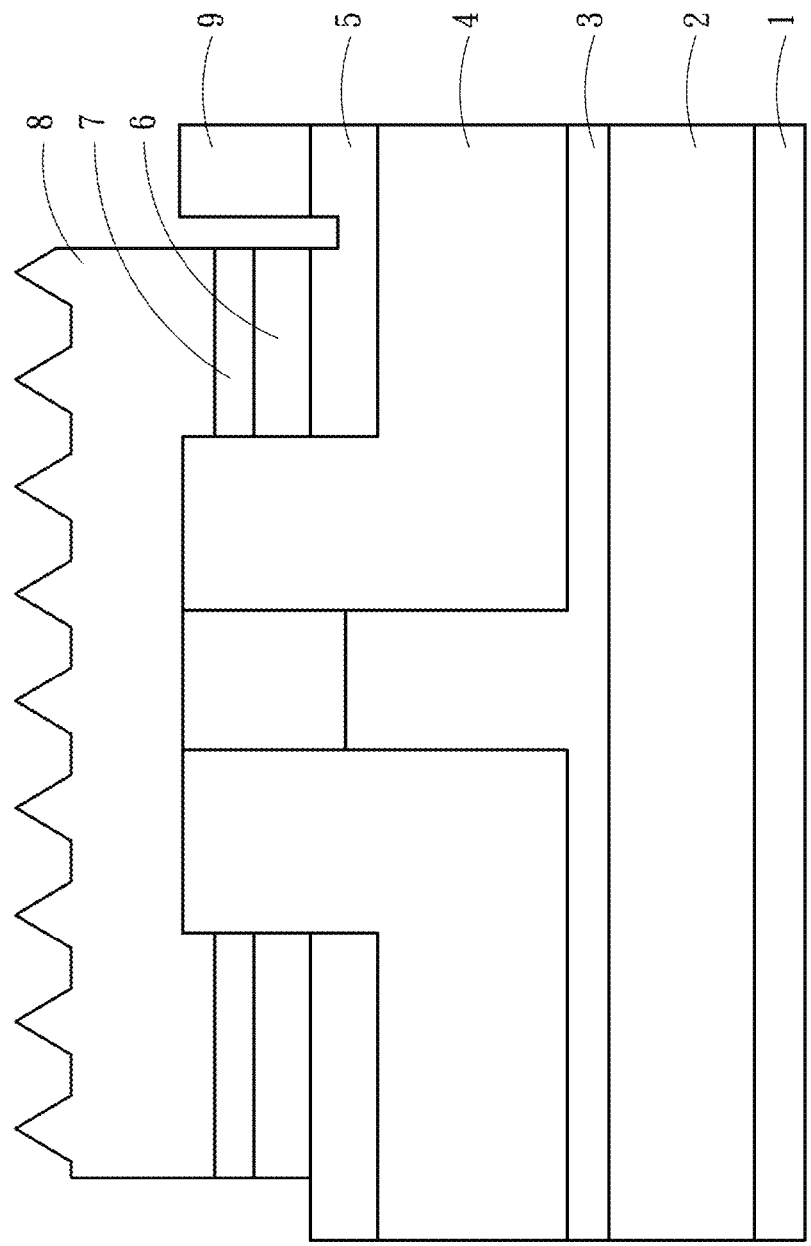
FIG. 2 is a section view of a conventional light emitting diode (LED) structure.
Figure 3:
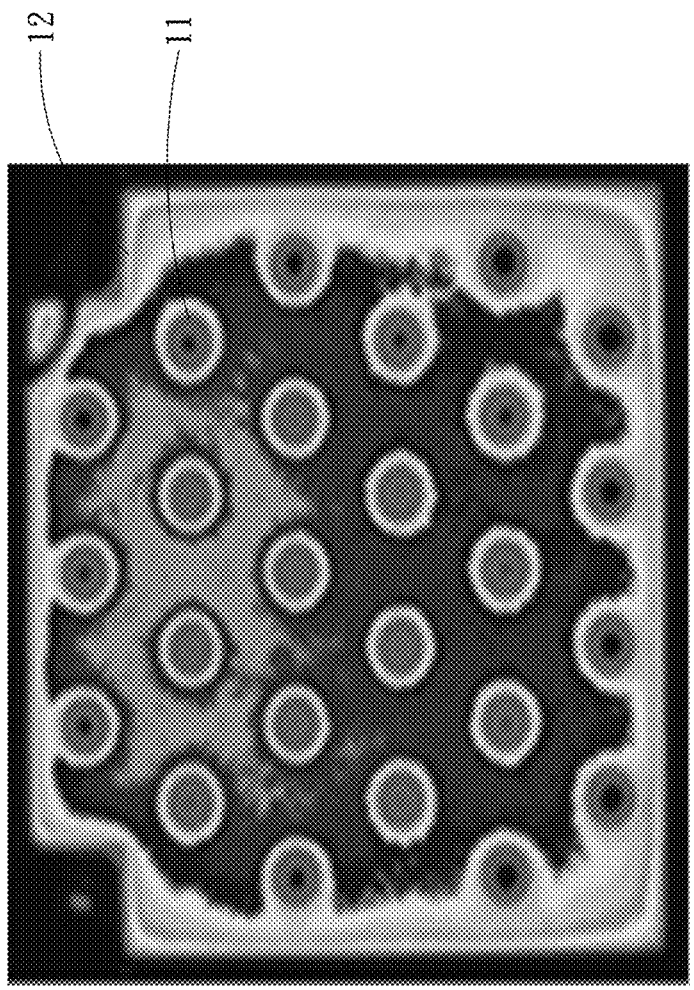
FIG. 3 is a schematic diagram of a light field distribution of a conventional light emitting region.
Figure 6:
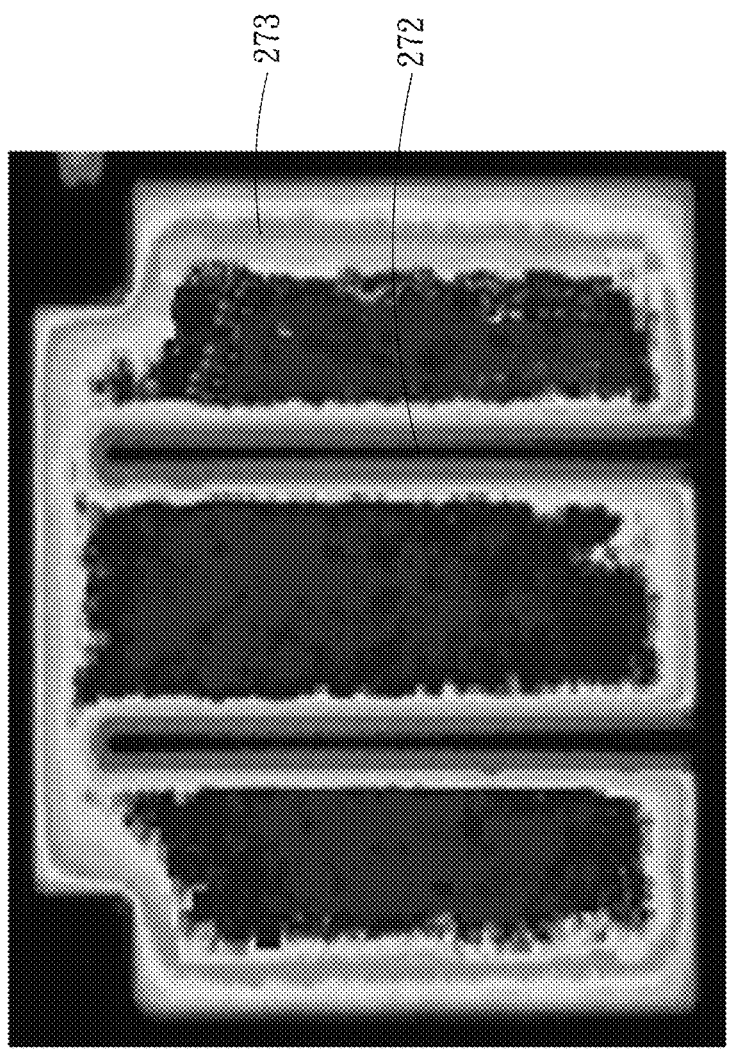
FIG. 6 is a schematic diagram of a light field distribution of a light emitting region of the present invention.

Referring to FIG. 6, the pattern distribution of the electrical connection structure 27 is least one strip-like shape to form the continuous electrode structure. Further, a corresponding non-light emitting region 272 is also strip-shaped, and has a smaller ineffective area compared to a conventional solution (e.g., FIG. 3); that is, the effective light emitting region is larger. In addition, light emitted from a border region 273 is more uniform.

The present invention provides at least the advantages below.

1. Through the contour of the pattern distribution, the ineffective area caused by the insulation layer is effectively reduced.

2. The border region of the light emitting region is similar to current diffusion paths, and so light emitted from the border region of the light emitting region is more uniform.

3. The strip-shaped continuous electrode structure adopted in the present invention is a continuous interface, which can be more easily processed in a manufacturing process compared to a conventional discontinuous interface, facilitating processes of micro-etching and coating.

What is claimed is:

1. A light emitting diode (LED) light emitting layer structure having a continuous electrode structure, comprising:
    a substrate;
    a negative electrode, formed under the substrate;
    an adhesive layer, formed on the substrate;
    an insulation layer, formed on the adhesive layer;
    a reflective layer, formed on the insulation layer;
    a positive electrode;
    an LED light emitting layer, the LED light emitting layer and the positive electrode formed on the reflective layer and spaced by a gap, the LED light emitting layer comprising a P-type semiconductor layer, a light emitting layer and an N-type semiconductor layer that are sequentially stacked on the reflective layer; and
    a single electrical connection structure, penetrating the insulation layer, and being spaced apart from the reflective layer, the P-type semiconductor layer and the light emitting layer, wherein the electrical connection structure penetrates through the reflective layer, the P-type semiconductor layer and the light emitting layer; the electrical connection structure is electrically connected between the adhesive layer and the N-type semiconductor layer, and the electrical connection structure has a pattern distribution that has at least one strip-like shape to form the continuous electrode structure;
    and wherein an ohmic contact layer is in contact with the p-type semiconductor layer and the reflective layer.

2. The LED light emitting layer having a continuous electrode structure of claim 1, wherein a jagged structure is further formed on a surface of the N-type semiconductor layer.

3. The LED light emitting layer having a continuous electrode structure of claim 1, wherein the reflective layer comprises a reflecting mirror protection layer and a reflecting mirror, the reflecting mirror is formed under the P-type semiconductor layer, and the reflecting mirror protection layer envelops the reflecting mirror.

4. The LED light emitting layer having a continuous electrode structure of claim 3, wherein an ohmic contact layer is further formed between the reflecting mirror and the P-type semiconductor layer.

5. The LED light emitting layer having a continuous electrode structure of claim 1, wherein the positive electrode is disposed on a surface of the reflective layer that is distal to the substrate.

* * * * *